(12) United States Patent
Baldwin et al.

(10) Patent No.: US 7,378,225 B2
(45) Date of Patent: May 27, 2008

(54) METHOD OF FORMING A METAL PATTERN ON A SUBSTRATE

(76) Inventors: Kyle Baldwin, 30 Titus Ln., Seymour, CT (US) 06483; John Ganjei, 650 Bucks Hill Rd., Southbury, CT (US) 06488; Elke Kotur, 925 Oronoke Rd. 19-B, Waterbury, CT (US) 06708

( * ) Notice: Subject to any disclaimer, the term of this patent is extended or adjusted under 35 U.S.C. 154(b) by 592 days.

(21) Appl. No.: 10/820,236

(22) Filed: Apr. 6, 2004

(65) Prior Publication Data
US 2005/0221232 A1    Oct. 6, 2005

(51) Int. Cl.
*G03F 7/00* (2006.01)
(52) U.S. Cl. .................................. 430/311; 430/315
(58) Field of Classification Search ............... 430/315, 430/270.1
See application file for complete search history.

(56) References Cited

U.S. PATENT DOCUMENTS

| | | | | |
|---|---|---|---|---|
| 4,035,320 A | * | 7/1977 | Lawson | 525/32.1 |
| 4,413,051 A | * | 11/1983 | Thomas | 430/312 |
| 4,582,778 A | * | 4/1986 | Sullivan | 430/273.1 |
| 4,804,615 A | | 2/1989 | Larson et al. | |
| 4,866,008 A | | 9/1989 | Brighton et al. | |
| 4,882,245 A | * | 11/1989 | Gelorme et al. | 430/14 |
| 5,359,928 A | * | 11/1994 | Blessington et al. | 101/128.4 |
| 5,374,503 A | | 12/1994 | Sachdev et al. | |
| 5,733,466 A | | 3/1998 | Benebo et al. | |
| 5,758,412 A | | 6/1998 | Knopp | |
| 5,766,967 A | * | 6/1998 | Lai et al. | 438/167 |
| 5,922,517 A | * | 7/1999 | Bhatt et al. | 430/315 |
| 6,044,550 A | | 4/2000 | Larson | |
| 6,255,035 B1 | * | 7/2001 | Minter et al. | 430/312 |
| 6,383,401 B1 | | 5/2002 | Labzentis et al. | |
| 6,423,463 B1 | | 7/2002 | Oota et al. | |
| 6,515,233 B1 | | 2/2003 | Labzentis et al. | |

* cited by examiner

*Primary Examiner*—Mark F. Huff
*Assistant Examiner*—Caleen O Sullivan
(74) *Attorney, Agent, or Firm*—Carmody & Torrance LLP

(57) ABSTRACT

The invention relates to a method of providing two distinct photoimageable film compositions, in particular, two distinct dry film compositions, on a substrate. Each of the two photoimageable film compositions is selected to have a different developing speed and/or curing speed so that, after development, the top layer of photoimageable film overhangs the bottom layer of photoimageable film. A metal layer is subsequently deposited over the surface of the substrate. The overhang allows for the clean removal of the photoimageable film layers, without damage to the subsequently applied metal layer, because the overhang prevents the metal layer from making intimate contact with the photoimageable film layers along the interface of the substrate with the photoimageable film layers.

19 Claims, 3 Drawing Sheets

Single Layer

Double Layer

SEM of two layered resists after developing

METHOD OF FORMING A METAL PATTERN ON A SUBSTRATE

FIELD OF THE INVENTION

This invention relates to a method of forming a metal pattern on the surface of a substrate. In particular, the method is particularly useful in preparing a sputtered image of gold on a substrate.

BACKGROUND OF THE INVENTION

The present invention relates to a method of forming a metal image in a desired pattern on a substrate. Two different photoimageable film layers are provided on the substrate, such that after exposure to actinic radiation to produce a negative of the desired image and subsequent development, a resulting "umbrella" is formed of the top photoimageable layer over the bottom photoimageable layer. A metal layer is subsequently deposited over the photoimageable film pattern on the substrate. The "umbrella" allows for the clean removal of the photoimageable film layers, without damage to the subsequently applied metal.

The invention is usable in processes such as the manufacture of printed wiring boards. A typical process for the manufacture of a printed wiring board is described in U.S. Pat. No. 6,044,550 to Larson et al., the subject matter of which is herein incorporated by reference in its entirety. The invention is also usable in a variety of other processes that have similar steps to the process described below for formulating a metal image on the substrate.

A typical procedure for making a metal image, on a substrate is as follows:

1) A dry film or other photoimageable layer is laminated or otherwise applied to the substrate.
2) A negative image is produced using actinic radiation on the photoimageable layer covering the substrate.
3) The unexposed photoimageable layer is developed off using a mild alkaline solution, such as 1% $K_2CO_3$, leaving the cleared substrate and the exposed resist.
4) The entire substrate is coated with a conductive metal. Preferably, a layer of gold is sputter coated onto the substrate.
5) As a result of step 4, conductive metal (gold) covers both the substrate and the photoimageable layer.
6) The remaining photoimageable layer is then stripped from the substrate using an alkaline solution, such as a 3% solution of KOH.
7) Finally, with the remaining photoimageable layer removed, the gold image remains on the substrate.

Suitable processes are described, for example, in U.S. Pat. No. 5,733,466 to Benebo et al., the subject matter of which is herein incorporated by reference in its entirety.

A major concern with the above described procedure is that the gold is coated up and over the photoimageable layer (dry film) pattern on the substrate (i.e., traces) in one continuous film. When the dry film is stripped off, the gold is ripped apart at the edges where the resist and the gold meet on the substrate surface. The result is a potentially ragged line of the gold remaining after stripping, and potential lifting of the unwanted resist pattern from the substrate.

In the case of the manufacture of printed wiring boards, when lifting occurs, there is potential to create unwanted plating between features on the printed wiring board, causing them to be electrically shorted or near shorted. Thus, it would be highly desirable to develop a manufacturing method that results in straight traces on the substrate, without ragged tear lines.

One way that has been suggested to avoid the ragged metal is to develop the dry film so that it has a severe negative foot, or under cut, near the surface of the substrate, thereby resulting in an "umbrella-effect" whereby the sputtered gold, deposited from above, would not coat directly up to the edge of the dry film/substrate interface. The disadvantage of such a severe negative foot is that it is difficult to consistently reproduce and can lead to resist failure, or lifting of the resist. This lifting can cause a short of the sputtered gold. Additionally, a negative foot may be non-uniform along the substrate-dry film interface.

Thus, there remains a need in the art for an improved method of producing gold traces on the surface of the substrate, that does not result in a ragged line of the gold trace remaining after the photoresist is stripped from the substrate.

The inventors have surprisingly discovered that the use of two layers of photoresist each having different break times and/or developing times and/or curing speeds produces a sandwich of the two layers, that has an "umbrella" effect of the top layer of photoresist over the bottom layer of photoresist. This "umbrella" or T shape of the photoresist sandwich significantly eliminates ragged lines along interface between the substrate and the dry film photoresist, which were common in the prior art.

SUMMARY OF THE INVENTION

The present invention relates to a method of producing the metal pattern on the substrate, the method comprising the following steps:

a) providing a first photoimageable film on the substrate;
b) providing a second photoimageable film directly over the first photoimageable film;
c) placing a negative image of the desired metal pattern over the second photoimageable film and exposing the first photoimageable film and the second photoimageable film to actinic radiation;
d) developing off uncured areas of the first photoimageable film and the second photoimageable film to produce an image on the substrate;
e) depositing metal onto the substrate, preferably over both the patterned areas and the unpatterned areas of the substrate; and
f) stripping the first photoimageable film and the second photoimageable film from the substrate to leave the desired metal pattern on the substrate.

In a preferred embodiment the photoimageable film layers are dry film photoresists that are laminated to the substrate. Optionally but preferably, the bottom resist has a lower break point and/or a faster developing time than the top layer.

In another preferred embodiment, the bottom layer of photoresist has a slower cure speed than the top layer of photoresist. The "sandwich" of the two layers is a top layer of photoresist that cures to a higher cross link density more quickly than the bottom layer of photoresist and that also develops more slowly such that the top photoimageable layer overhangs the bottom photoimageable layer. When metal is subsequently sputtered onto the surface of the substrate and the photoresist stripped off, the unique shape of the photoimageable layer, prevents the metal layer from making intimate contact with the photoimageable film layers along the interface of the substrate with the photoimageable film layers and thus does not cause ragged lines along the interface between the substrate and the dry film photoresist sandwich.

DETAILED DESCRIPTION OF THE PREFERRED EMBODIMENTS OF THE INVENTION

Figure 1:
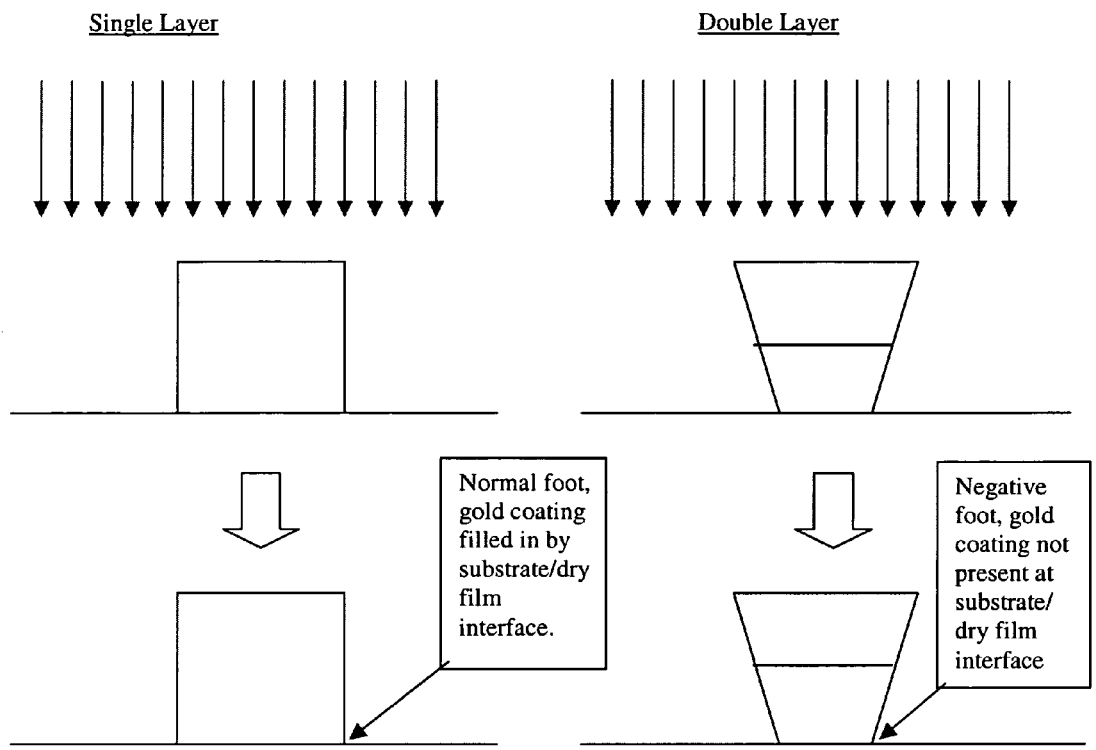
FIG. 1 compares a single layer photoimageable layer of the prior art with the two-layer photoimageable layer of the instant invention.

The present invention relates to the formation of a metal pattern on the surface of a substrate, wherein a negative image of the desired pattern is exposed and developed using a photoimageable film to produce the desired pattern. The metal is subsequently deposited on the substrate and the photoimageable film is removed to leave the desired metal pattern on the substrate. The improved process of the instant invention uses two distinct photoimageable films, each of which is selected to have a different developing speed and/or curing speed so that, after development, the top layer of photoimageable film overhangs the bottom layer of photoimageable film. The overhang allows for the clean removal of the photoimageable film layers, without damage to the subsequently applied metal layer, because the overhang prevents the metal layer from making intimate contact with the photoimageable film layers along the interface of the substrate with the photoimageable film layers.

The present invention is usable in a variety of processes that require a desired metal pattern on a substrate, including the manufacture of printed circuit boards. Other processes are also known to those skilled in the art.

The method of producing the metal pattern on the substrate generally comprises the following steps:

a) providing a first photoimageable film on the substrate;

b) providing a second photoimageable film directly over the first photoimageable film;

c) placing a negative image of the desired metal pattern over the second photoimageable film and exposing the first photoimageable film and the second photoimageable film to actinic radiation;

d) developing off uncured areas of the first photoimageable film and the second photoimageable film to produce an image on the substrate;

e) depositing metal onto the substrate over both the patterned areas and the unpatterned areas of the substrate or at least onto the exposed substrate and f) stripping the first photoimageable film and the second photoimageable film from the substrate to leave the desired metal pattern on the substrate.

In one of the preferred embodiments of the invention, the bottom layer is formulated so that it develops more quickly than the top layer. For example, the developing dwell time of the bottom layer is selected to be about 40 to about 60 seconds, while the developing dwell time of the top layer is selected to be about 80 to about 120 seconds. In another related embodiment the two layers have different curing speeds. For example, the curing speed in millijoules (mJ) of the bottom layer is selected to be about 30 to about 100 mJ and the curing speed of the top layer is selected to be about 5 to about 20 mJ. The bottom layer may also have a different, i.e., lower, breaking point than the top layer. For example, the bottom layer may have a breaking point of 30%, while the breaking point of the top layer may be about 60%.

The first photoimageable film and the second photoimageable film are typically dry film compositions and are each formulated from a composition comprising one or more binders, one or more monomers, and a photoinitiator system in an appropriate solvent. Other additives may also be added to enhance various properties of the composition, including adhesion promoters, stabilizers, flow agents, and surfactants. Suitable compounds are generally known to one skilled in the art.

The solvent is generally selected from the group consisting of methyl ethyl ketone, acetone, toluene, and mixtures of the foregoing. Other similar compounds may also be used and would be known to one skilled in the art.

The binder is chosen such that it will be soluble in a mild alkaline solution, in order to allow for the uncured areas of photoresist to be developed off. The binder is generally an acrylic or methacrylic binder and is generally comprised of one or more of the derivatives of methyl, ethyl, propyl, and butyl acrylates and methacrylates. Styrene based maleic ester polymers such as SS550® (available from Hercules) may also be used.

Suitable binders may be selected from (meth)acrylic acid, itaconic acid, ethyl(meth)acrylate, n-butyl(meth)acrylate, propyl(meth)acrylate, methyl(meth)acrylate, octyl(meth)acrylate, n-hexyl(meth)acrylate, t-butyl(meth)acrylate, secbutyl (meth)acrylate, isobutyl(meth)acrylate, 2-ethyl hexyl(meth)acrylate, styrene, substituted styrenes, vinyl esters, and mixtures of the foregoing.

The glass transition temperature of the binder is generally within the range of 80° C. to 130° C. and is preferably 110° C. The A# (A# is defined as milligrams hydroxide per grams binder: mg $OH^-$/g binder) of the binder is generally in the range of 60 to 220, and is preferably 110 for the top and 145 for the bottom. The molecular weight (Mw) of the binder is preferably between 50,000 and 200,000, preferably 90,000. The binder ratio, in the absence of solvents is generally in the range of 40% to 70%, and is preferably 55%.

The monomers of the photoimageable composition are alpha- and beta-ethylenically unsaturated compounds that are polymerizable by free radical initiated chain propagating addition polymerization. The monomers belong to the family of acrylic or methacrylic acid or acid esters, or vinyl ethers, polyester acrylates, or polyurethane acrylates. Examples of suitable monomers include allyl(meth)acrylate, tetrahydrofurfuryl (meth)acrylate, isodecyl(meth)acrylate, 2(2-ethoxyethoxy)ethyl(meth)acrylate, stearyl (meth)acrylate, lauryl(meth)acrylate, 2-phenoxyethyl(meth)acrylate, glycidyl (meth)acrylate, isobornyl(meth)acrylate, tridecyl (meth)acrylate, isooctyl(meth)acrylate, caprolactone (meth) acrylate, polyethylene glycol (meth)acrylate, propylene glycol (meth)acrylate, ethylene glycol (meth)acrylate, 1,3-butylene glycol di(meth)acrylate, 1,6-hexanediol di(meth) acrylate, neopentyl glycol di(meth)acrylate, polyethylene glycol di(meth)acrylate, polypropylene glycol di(meth)acrylate, ethoxylated bisphenol A di(meth)acrylate, propoxylated bisphenol A di(meth)acrylate, alkoxylated cyclohexane dimethanol di(meth)acrylate, cyclohexane dimethanol di(meth)acrylate, trimethylolpropane tri(meth)acrylate, ethoxylated trimethylolpropane tri(meth)acrylate, propoxylated trimethylolpropane tri(meth)acrylate, tris(2-hydroxy ethyl)isocyanurate tri(meth)acrylate, pentaerythritol tri (meth)acrylate, ethoxylated glycerol tri(meth)acrylate, propoxylated glycerol tri(meth)acrylate, pentaerythritol tetra (meth)acrylate, ethoxylated pentaerythritol tetra(meth) acrylate, propoxylated pentaerythritol tetra(meth)acrylate, dipentaerythritol penta(meth)acrylate, dipentaerythritol hexa(meth)acrylate, polyester (meth)acrylates, polyurethane (meth)acrylates, and combinations of the foregoing. It is preferable that the composition contain a combination of monomers, wherein at least one monomer is monofunctional and that at least one monomer is multifunctional.

To initiate free-radical addition polymerization and crosslinking of the binder polymer within the photopolymerizable monomers upon exposure to actinic radiation, the photoimageable composition contains a free-radical generating photoinitiator system. Suitable photoinitiators include, but are not limited to, benzoin ethers, benzil ketals, acetophenones, and benzophenones.

Each of the dry film photoresists of the invention is manufactured in the same fashion, and is generally a photoimageable film made as a UV-sensitive film "sandwich." The photoimageable composition is coated over a carrier sheet with subsequent removal of solvent. The carrier sheet is generally a polymer, such as polyester or polyethylene terephthalate (PET). A removable protective layer, such as polyethylene, is applied to the other side of the photoimageable composition to prevent the adhesion of the material to the back side of the roll. The protective layer is then removed prior to lamination.

The first layer of dry film, i.e., the layer with faster developing time and slower exposure time, is laminated to the substrate using pressure and/or heat. The polyester cover sheet is then removed, and the second layer of dry film, i.e., the layer with slower developing time, and/or faster curing time, is then laminated over the existing first layer of dry film. The difference in developing time and/or curing speed between the two layers may be accomplished by differences in composition. Varying the type or amount of binder and monomers in the two compositions can accomplish this purpose. It is particularly effective to chose binders with differing degrees of hydrophobicity/hydrophilicity for each layer. In the alternative concentration or type of photo initiator may be varied between the composition. In either case the object is to obtain a difference in curing/development speed between the two resist compositions. However, even if the same composition is used for both layers, the same effect can be achieved to some extent because of the attenuation of actinic radiation as it penetrates to the second layer.

A negative image of artwork is placed over the two layers of photoresist, with the polyester cover sheet from the second layer still in place. The two resist layers are then exposed using actinic radiation for a time sufficient to cure the top layer, but not enough time to fully cure the bottom based upon the developing speed chosen. For example, the resist layers may be exposed at 15 mJ for a developing speed of 120 seconds. Other combinations of curing time and developing speed are also possible.

The polyester cover sheet is then removed from the top layer of photoresist and the uncured dry film areas remaining are developed off using a mild alkaline solution. One suitable alkaline solution usable with the invention is a 1% solution of $K_2CO_3$.

After development, the present invention yields a second photoimageable film that overhangs the first photoimageable film on the substrate such that the subsequently applied metal layer does not make intimate contact with the first and second photoimageable films along the interface of the substrate with the first and second photoimageable layers, and the first and second photoimageable layers can be cleanly removed to yield a non-ragged edge between the substrate and the metal pattern on the substrate.

The metal layer is preferably deposited by sputter coating but it can also be done by other methods such as plating. Although gold is typically the chosen metal, other metals may also be applied to the substrate, including nickel, copper, tin, platinum, silver, palladium. The two-layer photoresist is then stripped off using either a caustic solution or an amine based proprietary stripping solution known to those in the art. The stripping action works through the gold on the surface of the dry film layers to strip the dry film.

Figure 2:
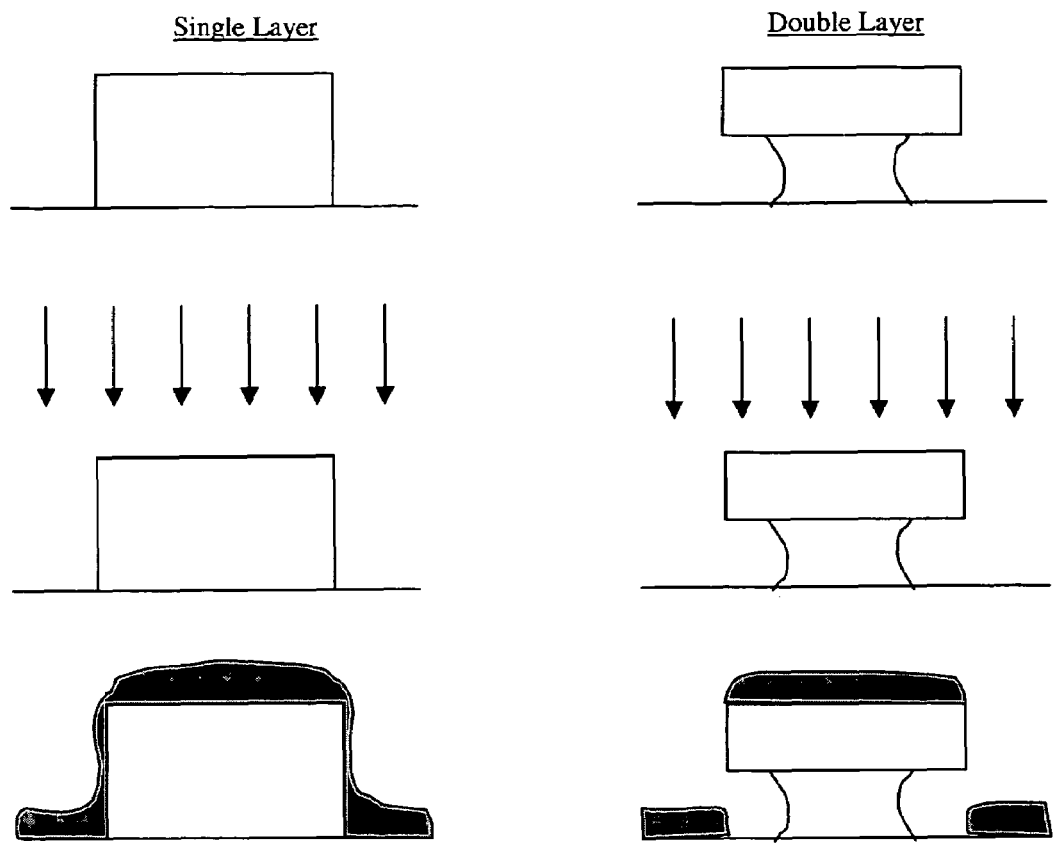
FIG. 2 shows the photoimageable layers, with a metal layer deposited on the surface.
Figure 3:
FIG. 3 depicts an SEM of a two-layered photoresist of the invention after the developing step.

FIGS. 1 and 2 demonstrate the advantages of using the two layer photoimageable film of the present invention. The first view shown in FIG. 1 shows a conventional single layer dry film photoresist on a substrate, wherein gold fills in at the substrate/dry film interface, as depicted in FIG. 2. The second view shown in FIG. 1, depicts the two layer dry film photoresist of the present invention, wherein gold is not present at the substrate/dry film interface. This effect is further evident in FIG. 3, which shows a scanning electron microscope (SEM) of the two layered resist of the present invention after developing.

In this example, the top layer of photoresist had a faster curing and a slower developing time than the bottom layer. The result shows a hard cured top that has little attack along its side wall, maintaining the resist integrity. The bottom layer has less cross link density and developed faster, yielding attack of its sidewall geometry. The result is an umbrella-effect over the substrate at the dry film-substrate interface.

A typical formulation of the bottom layer of photoresist generally comprises the following:

40 to 60% by weight of an acrylic alkaline developable binder with an A# between 125 to 220.

20 to 40% by weight one or more monomers such as an ethoxylated trimethylolpropane triacrylate.

1 to 10% by weight of one or more photoinitiators such as benzophenone.

0.2% to 2% by weight of print out dye such as leuco crystal violet 0.01 to 0.10% by weight of background dye such as crystal green 0.01 to 0.05% by weight of radical scavengers and inhibitors such as NPAL 0.3 to 1.5% by weight of dye oxidizer such as pentabromochloro cyclohexane 0 to 0.1% by weight of photo accelerant such as N-phenyl glycine A typical formulation of the top layer of photoresist generally comprises the following:

40 to 60% by weight of an acrylic alkaline developable binder with an A# between 80 to 120.

20 to 40% by weight of one or more monomers such as ethoxylated bisphenol A diacrylate.

1 to 10% by weight of one or more photoinitiators such as benzophenone.

0.2% to 2% by weight of print out dye such as leuco crystal violet 0.01 to 0.10% by weight of background dye such as crystal green 0.005 to 0.02% by weight of radical scavengers and inhibitors such as NPAL 0.3 to 1.5% by weight of dye oxidizer such as pentabromochloro cyclohexane 0.1 to 0.6% by weight of photo accelerant such as N-phenyl glycine Photoimageable compositions of the invention are typically formulated by mixing in solvent all of the ingredients that make up the composition with an air stirrer and then drawing down the composition, drying the composition to remove solvent, and then laminating the photoresist composition to the desired substrate for further processing.

EXAMPLE 1 for top resist

| Hydrophobic-fast cure Top Layer | | |
|---|---|---|
| Material | CAS # | Dry |
| B2 | — | 57.228 |
| BPA(EO)DA | 41637-38-1 | 33.913 |
| NPAL | 15305-07-4 | 0.009 |
| MICKET | 90-94-8 | 0.101 |
| BENZO | 119-61-9 | 4.037 |
| BCIM | 1707-68-2 | 2.719 |
| PBCH | 87-84-3 | 0.770 |
| TBC | 77-94-1 | 0.933 |
| Crystal green | 633-03-4 | 0.036 |
| LEUCO | 548-62-9 | 0.255 |
| NPG | 103-01-5 | 0.360 |
| | | 100.000 |

B2: 60,000 Mw; 110 Tg; A#110

EXAMPLE 2 for bottom resist

| Hydrophilic-slow cure Bottom Layer | | |
|---|---|---|
| Material | CAS # | Dry |
| B1 | — | 52.973 |
| TMP(EO)TA | 41637-38-1 | 38.400 |
| NPAL | 15305-07-4 | 0.020 |
| MICKET | 90-94-8 | 0.127 |
| BENZO | 119-61-9 | 4.225 |
| BCIM | 1707-68-2 | 1.024 |
| PBCH | 87-84-3 | 1.024 |
| TBC | 77-94-1 | 1.370 |
| crystal green | 633-03-4 | 0.009 |
| LEUCO | 548-62-9 | 0.829 |
| | | 100.000 |

B1: 90,000 Mw; 110 Tg; A#145

| BPA (EO) DA | Exthoxylated Bis-phenol A diacrylate |
|---|---|
| TMP (EO) TA | Exthoxylated trimethylolpropane triacrylate |
| NPAL | Tris(N-nitroso-N-phenylhydroxylamine)aluminum salt |
| Micket | Michler's ketone |
| Benzo | Benzophenone |
| BCIM | 2,2 bis(2-chlorophenyl)-4,4-5,5-tetra phenyl-1,2 biimidazole |
| PBCH | Pentabromochloro cyclohexane |
| TBC | Tributyl Citrate |
| LEYNCO | Leuco crystal violet |
| NPG | N-phenylglycine |

What is claimed is:

1. A method of producing a metal pattern on a substrate comprising the steps of:
    a) providing a first photoimageable dry-film layer on the substrate;
    b) laminating a second photoimageable dry-film layer directly over the first photoimageable dry-film layer, wherein said second photoimageable dry-film layer is formulated to have a slower development time than the first photoimageable dry-film layer and/or a faster curing speed than the first photoimageable layer;
    c) placing a negative image of the desired metal pattern over the second photoimageable dry-film layer and exposing the first photoimageable dry-film layer and the second photoimageable dry-film layer to actinic radiation;
    d) developing off uncured areas of the first photoimageable dry-film layer and the second photoimageable dry-film layer with a developer capable of developing off uncured areas of both the first photoimageable dry-film layer and the second photoimageable dry film layer to produce an image on the substrate;
    e) depositing metal onto the substrate, wherein the metal is deposited over both the patterned areas and unpatterned areas of the substrate; and
    f) stripping the first photoimageable dry-film layer and the second photoimageable dry-film layer from the substrate to leave the metal pattern on the substrate.

2. The method according to claim 1, wherein the development dwell time of the first photoimageable dry-film layer is between about 40 and about 60 seconds and the development dwell time of the second photoimageable dry-film layer is between about 80 and about 120 seconds.

3. The method according to claim 1, wherein the curing speed of the first photoimageable dry-film layer is between about 30 and about 100 mJ and the curing speed of the second photoimageable dry-film layer is between about 5 and about 20mJ.

4. A method according to claim 1, wherein the first photoimageable dry-film layer and the second photoimageable dry-film layer are each formulated from a composition comprising one or more binders, one or more monomers, a photoinitiator, and a suitable solvent.

5. A method according to claim 4, wherein the one or more binders are selected from the group consisting of (meth)acrylic acid, itaconic acid, ethyl(meth)acrylate, ributyl (meth)acrylate, propyl (meth)acrylate, methyl (meth)acry late, octyl acrylate, ri-hexyl acrylate, t-butyl acrylate, secbutyl acrylate, isobutyl acrylate, 2-ethyl hexyl acrylate, styrene, isobutyl methacrylare, substituted styrenes, and vinyl esters.

6. A method according to claim 4, wherein the one or more monomers are selected from the group consisting of acrylic and methacrylic acid and acid esters, vinyl ethers, polyester acrylates, and polyurethane acrylates.

7. A method according to claim 6, wherein the one or more monomers are selected from the group consisting of allyl (meth)acrylate, tctrahydrofbrfuryl (meth)acrylate, isodecyl (meth)acrylate, 2(2-ethoxyethoxy) ethyl (met.h)acrylate, stearyl (meth)acrylate, lauryl (meth)acrylate, 2-phenoxyethyl (meth)acrylate, glycidyl (meth)acxylate, isobornyl (rneth)acrylate, tridecyl (meth)aerylate, isooctyt (meth)acrylate, caprolactone (meth)acrylate, polyethylene glycol (meth)acrylate, propylene glycol (meth)acrylate, ethylene glycol (meth)acrylate, 1,3-butylene glycol di(meth)acrylate, 1,6-hexanediol di(meth)acrylate, neopentyl glycol di(meth)acrylate, polyethylene glycol di(meth)acrylate, polypropylene glycol di(meth)acrylate, ethoxylated A di(meth)acrylate, propoxylated bisphenol A di(meth)acrylate, alkoxylated cyclohexane dimethanol di(meth)acrylate, cyclohexane dimethanol di(meth)acrylate, trimethyloipropane tri(meth)acry late, ethoxylated trimethyloipropane tri (meth)acrylate, propoxylated trimethyloipropane tri(meth) acrylate, tris (2-hydroxy ethyl) isocyanurate tri(meth) acrylate, pentaerythritol tri(meth)acrylate, ethoxylated glycerol tri(meth)acrylate, propoxylated glycerol tri(meth) acrylate, pentaerytbritoj tetra(meth)acrylate, ethoxylated pentaerythritol tetra(meth)acrylate, propoxylated pcntaerythritol terra(meth)acrylate, dipentaerythritol penta(meth)acrylatc, dipentaerythritol hexa(meth)acrylate, polyester (meth)acrylates, polyurethane (meth)acrylates, and combinations of the foregoing.

8. A method according to claim 4, wherein the photoinitiator is selected from the group consisting of beozoin ethers, benzil ketals, acetophenones, benzophenones, and combinations of the foregoing.

9. A method according to claim 4, wherein the composition that makes up the first photoimageable dry-film layer or the second photoimageable dry-film layer further comprises one or more additives selected from the group consisting of adhesion promoters, stabilizers, flow additives, surfactants, and other additives.

10. The method according to claim 4, wherein the composition is coated over a carrier sheet, and the solvent is subsequently removed.

11. The method according to claim 10, wherein the carrier sheet is selected from the group consisting of polyester and polyethylene rerephthalate.

12. The method according to claim 10, wherein a removable protective layer is applied to the top of the composition.

13. The method according to claim 12, wherein the first photoimageable dry-film layer is applied to the substrate by lamination using pressure, heat, or heat and pressure, and the protective cover layer is removed.

14. The method according to claim 13, wherein the second photoimageable dry-film layer is applied over die first photoimageable dry-film layer by lamination using pressure, heat, or heat and pressure, and the negative image of the desired metal pattern is applied over the second photoimageable dry-film layer with the protective cover layer still in place.

15. The method according to claim 1, wherein after development, the second photoimageable dry-film layer overhangs the first photoimageable dry-film layer on the substrate.

16. The method according to claim 1, wherein the metal layer is deposited by sputter coating.

17. The method according to claim 16, wherein the metal is gold.

18. The method according to claim 1, wherein the step of stripping the first photoimageable dry-film layer and the second photoimageable dry-film layer from the substrate comprises using a caustic solution or an amine shipping solution.

19. The method according to claim 1, wherein the first photoimageable dry-film in layer has a breaking point of about 30% and the second photoimageable dry-film layer has a breaking point of about 60%.

* * * * *

UNITED STATES PATENT AND TRADEMARK OFFICE
CERTIFICATE OF CORRECTION

PATENT NO. : 7,378,225 B2
APPLICATION NO. : 10/820236
DATED : May 27, 2008
INVENTOR(S) : Kyle Baldwin et al.

It is certified that error appears in the above-identified patent and that said Letters Patent is hereby corrected as shown below:

Column 8

Line 46, delete "ri-butyl" and replace it with --n-butyl--
Line 48, delete "acry late" and replace it with --acrylate--
Line 48, delete "ri-hexyl" and replace it with --n-hexyl--
Line 50 claim 5, delete "methacrylare" and replace it with --methacrylate--
Line 58 claim 7, delete "tetrahydroforfuryl" and replace it with --tetrahydrofurfuryl--
Line 59 claim 7, delete "(met.h)acrylate" and replace it with --(meth)acrylate--
Line 61 claim 7, delete "(meth)acxylate" and replace it with --(meth)acrylate--
Line 62 claim 7, delete "(meth)aerylate" and replace it with --(meth)acrylate--

Column 9

Line 5 claim 7, delete "acry late" and replace it with --acrylate--
Line 5 claim 7, delete "trimethyloipropane" and replace it with --trimethylolpropane--
Line 6 claim 7, delete "trimethyloipropane" and replace it with --trimethylolpropane--
Line 10 claim 7, delete "pentaerytbritoj" and replace it with --pentaerythritol--
Line 12 claim 7, delete "terra(meth)acrylate" and replace it with --tetra(meth)acrylate--
Line 17 claim 8, delete "beozoin" and replace it with --benzoin--
Line 31 claim 8, delete "rerephthalate" and replace it with --terephthalate--

Signed and Sealed this

Twenty-ninth Day of July, 2008

JON W. DUDAS
*Director of the United States Patent and Trademark Office*